United States Patent
Alers

[11] Patent Number: 6,001,741
[45] Date of Patent: Dec. 14, 1999

[54] METHOD FOR MAKING FIELD EFFECT DEVICES AND CAPACITORS WITH IMPROVED THIN FILM DIELECTRICS AND RESULTING DEVICES

[75] Inventor: Glenn B. Alers, Chatham, N.J.

[73] Assignee: Lucent Technologies Inc., Murray Hill, N.J.

[21] Appl. No.: 09/060,420
[22] Filed: Apr. 15, 1998
[51] Int. Cl.[6] .................... H01L 21/00; H01L 21/3065
[52] U.S. Cl. ............................. 438/706; 438/778
[58] Field of Search ................... 438/710, 706, 438/778

[56] References Cited

U.S. PATENT DOCUMENTS

| | | |
|---|---|---|
| 4,762,728 | 8/1988 | Keyser et al. ................ 438/439 |
| 5,337,207 | 8/1994 | Jones et al. ................ 361/321.1 |
| 5,442,585 | 8/1995 | Eguchi et al. ................ 365/149 |

*Primary Examiner*—Robert Kunemund
*Assistant Examiner*—Lynette T. Umez-Eronini

[57] ABSTRACT

An electronic device is formed by depositing a thin film of high dielectric constant material on a silicon substrate, exposing the structure to plasma, and then forming the top electrode. The plasma substantially reduces the density of charge traps at the dielectric/silicon interface. Advantageously, the dielectric film is passivated with a nitrogen-containing material before forming the top electrode to prevent interdiffusion between the electrode and the dielectric.

8 Claims, 3 Drawing Sheets

METHOD FOR MAKING FIELD EFFECT DEVICES AND CAPACITORS WITH IMPROVED THIN FILM DIELECTRICS AND RESULTING DEVICES

FIELD OF THE INVENTION

This invention relates to a method for making electronic devices with improved thin film dielectrics and to the resulting devices.

BACKGROUND OF THE INVENTION

Field effect devices, such as field effect transistors, are fundamental components in modern electronics. They are basic components in most digital and many analog circuits, including circuits for data processing and telecommunications. Indeed it has been surmised that field effect transistors are among the most numerous of human-made objects.

Field effect devices typically comprise a controllable-conductivity path, called a channel, disposed between a source and a drain. A gate electrode is formed on a thin dielectric film overlying the channel. For example, the source and the drain can be n-type regions of silicon, and the channel can be a p-type region connecting them. The gate electrode can be a conductively doped polysilicon layer formed on a thin layer of silicon oxide dielectric overlying the channel.

If no voltage is applied to the gate, current cannot flow from the source to the channel or from the channel to the drain. However if a sufficient positive voltage is applied to the gate, electrons are induced into the channel region, thereby creating a continuous n-type conductive path between the source and the drain.

Capacitors are also important components of integrated circuits. A typical capacitor comprises first and second conductive layers separated by a thin dielectric film.

The reliable operation of integrated circuits is critically dependent on the reliability of the increasingly thin dielectric layers used in circuit devices. As transistors have become smaller and more densely packed, the dielectrics have become thinner. Capacitor and gate dielectrics are often less than 80 angstroms in thickness. With the arrival of ULSI technology, gate dielectrics are approaching 50 angstroms or less. For integrated circuits to work, these thin layers in each of thousands of different transistors must provide sufficient capacitance to drive the device, protect the channel from migration of impurities and avoid production of charge traps at their interfaces. These demanding requirements may soon exceed the capacities of conventional silicon oxide layers. Silicon oxide layers less than 2 nm will have prohibitively large leakage currents.

Efforts to replace silicon oxide as the gate dielectric have thus far proved less than satisfactory. Because of its relatively low dielectric constant ($\approx 3.9$), the largest capacitance obtainable with a thin layer of silicon oxide is about 25 $fF/\mu m^2$. This limits the scaling of transistors to smaller sizes because the capacitance will not be sufficient to drive the device. Higher dielectric constant tantalum oxide has been tried, but results are poor due to a high density of charge traps at the dielectric/silicon interface. Composite layers of $SiO_2/Ta_2O_5$ and $SiO_2/Ta_2O_5/SiO_2$ were tried, but the necessary resulting thicknesses limit the capacitance which can be obtained. Efforts have also been made to prevent charge traps by depositing a thin layer of silicon nitride between the silicon and the tantalum oxide. But the nitride layer also reduces the capacitance and thus limits scaling of the device. See U.S. Pat. No. 5,468,687 issued to D. Carl et al on Nov. 21, 1995 and Y. Momiyama et al, "Ultra-Thin $Ta_2O_5/SiO_2$ Gate Insulator with TiN Gate", 1997 *Symposium on VLSI Technology*, Digest of Technical Papers, pp. 135–136. Accordingly, there is a need for an improved method for making devices having thin layers of high dielectric constant.

SUMMARY OF THE INVENTION

In accordance with the invention, an electronic device is formed by depositing a thin film of high dielectric constant material on a silicon substrate, exposing the structure to plasma, and then forming the top electrode. The plasma substantially reduces the density of charge traps at the dielectric/silicon interface. Advantageously, the dielectric film is passivated with a nitrogen-containing material before forming the top electrode to prevent interdiffusion between the electrode and the dielectric.

BRIEF DESCRIPTION OF THE DRAWINGS

The advantages, nature and various additional features of the invention will appear more fully upon consideration of the illustrative embodiments now to be described in detail. In the accompanying drawings.

It is to be understood that these drawings are for purposes of illustrating the concepts of the invention and, except for the graphs, are not to scale.

DETAILED DESCRIPTION

Figure 1:
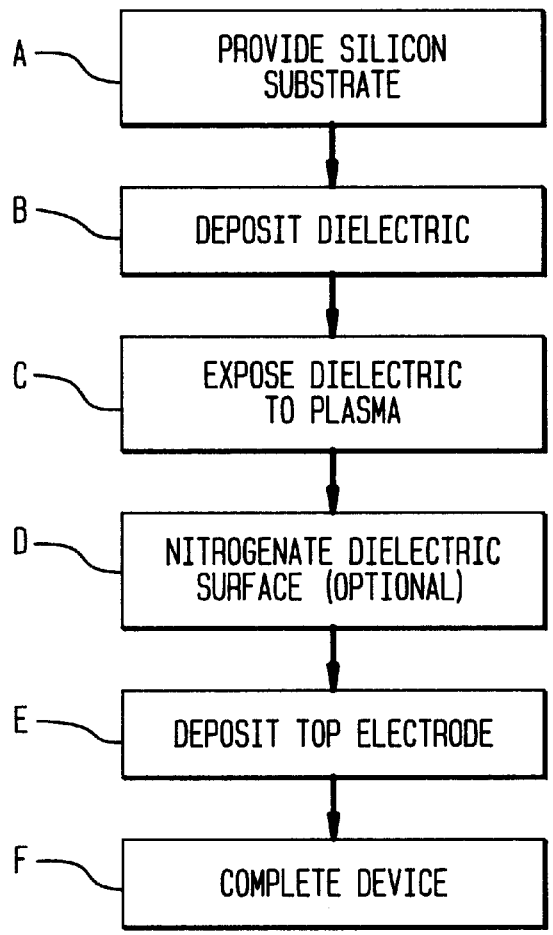
FIG. 1 is a flow diagram showing the steps of the preferred method of making an electronic device having an improved dielectric layer.

Referring to the drawings, FIG. 1 illustrates the steps in making an electronic device having an improved thin film dielectric. As shown in block A of FIG. 1, the first step is to provide a substrate having an exposed silicon surface. Preferably the substrate is a conventional single crystalline silicon wafer. As a preliminary step, the silicon surface can be cleaned by a conventional process used to remove native oxide and surface contaminants, such as the well known "RCA" clean.

The next step shown in block B is to deposit a thin layer of high dielectric constant material such as tantalum oxide or silicon nitride having a thickness in the range of 2–10 nm. The dielectric can be deposited directly on the silicon surface as by chemical vapor deposition. The deposition should be at a temperature of less than 500° C. in order to prevent oxidation of the cleaned silicon surface during deposition.

The third step (Block C) is to expose the deposited dielectric to plasma in order to passivate the dielectric/silicon interface and to reduce leakage currents. Preferably this exposure is to a remote microwave downstream plasma. Oxygen and/or nitrogen plasmas have proved satisfactory. For example, an oxygen plasma at 2 torr, substrate temperature 100–400° C. (preferably 300° C.) passivates and stabilizes the interface and reduces leakage currents. The interface is even further stabilized by subsequent similar exposure to nitrogen plasma. Alternatively, a nitrogen plasma at 2 torr, substrate temperature 100–400° C. can be used to stabilize the interface, followed by an oxygen plasma (similar conditions) to reduce leakage currents.

An optional additional step shown in block D is to nitrogenate the dielectric surface, i.e. to add a nitrogen-containing material at the top surface so that it will passivate the gate/dielectric interface when the top electrode is applied. The nitrogenation can be accomplished by ion implantation of nitrogen at the oxide surface, by thermal decomposition of $NH_4$, or by deposition of a silicon nitride layer, as by plasma enhanced deposition or by thermal decomposition.

The fifth step (block E) is to deposit the top electrode. This step typically involves depositing a top electrode of polysilicon, or metal such as TiN, TaN, W or WN. The deposition can by CVD or PVD, preferably at a temperature of less than 800° C.

The final step shown in block F is to complete the device in the conventional manner. For example, a polysilicon layer can be patterned to define the gate, source and drain of a field effect transistor in accordance with the widely-used self-aligned silicon gate process. This process is described, for example, in S. J. Hillenius et al., "A Symmetric Sub-Micron CMOS Technology", *IEDM Tech. Digest*, 252 (1986) which is incorporated herein by reference. Alternatively, a capacitor can be completed by applying polysilicon over the dielectric and patterning the polysilicon to define the capacitor top electrode.

Figure 2:
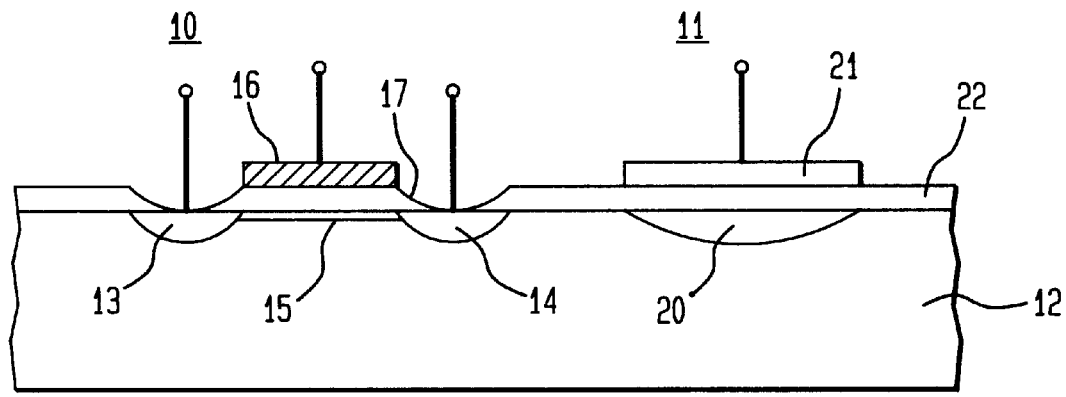
FIG. 2 is a schematic cross section illustrating a field effect device and a capacitor having an improved dielectric layer.

FIG. 2 is a schematic cross section of an exemplary electronic device illustrating a field effect device 10 and a capacitor 11, each having improved dielectric layers in accordance with the invention. While not necessary for the invention, in this particular instance both the field effect device and the capacitor are formed on a common substrate 12, such as a crystalline silicon wafer.

The field effect device 10 (here a transistor) essentially comprises a source 13, a drain 14 and a channel 15, each of which can comprise a doped region of silicon supported by substrate 12. A gate electrode 16 overlies the channel 15 and is separated from the channel by a thin dielectric film 17. As depicted, the dielectric film has a pair of major interfaces adjacent the gate electrode 16 (the gate/dielectric interface) and the channel 15 (the dielectric/Si interface). The dielectric film typically has a thickness of less than about 80 angstroms.

The gate electrode 16 is typically a thin layer of polycrystalline silicon doped to exhibit conductivity.

When the field effect device is in the ON condition, current flows through the channel between the source and the drain.

In accordance with the invention, the dielectric film 17 comprises a thin layer of high dielectric constant (dielectric constant>5) such as tantalum oxide or silicon nitride whose dielectric/Si interface has been passivated by plasma. Advantageously, the gate/dielectric interface has been passivated by nitrogenation.

Capacitor 11 comprises a pair of conductive layers 20 and 21 separated by a thin dielectric film 22. Layer 20 can be conductively doped crystalline silicon and layer 21 can be a conductively-doped polycrystalline silicon film. The dielectric film 22 can be the same kind of dielectric as film 17. Indeed, dielectrics 17 and 22 can be made of the same layer.

Figure 3:
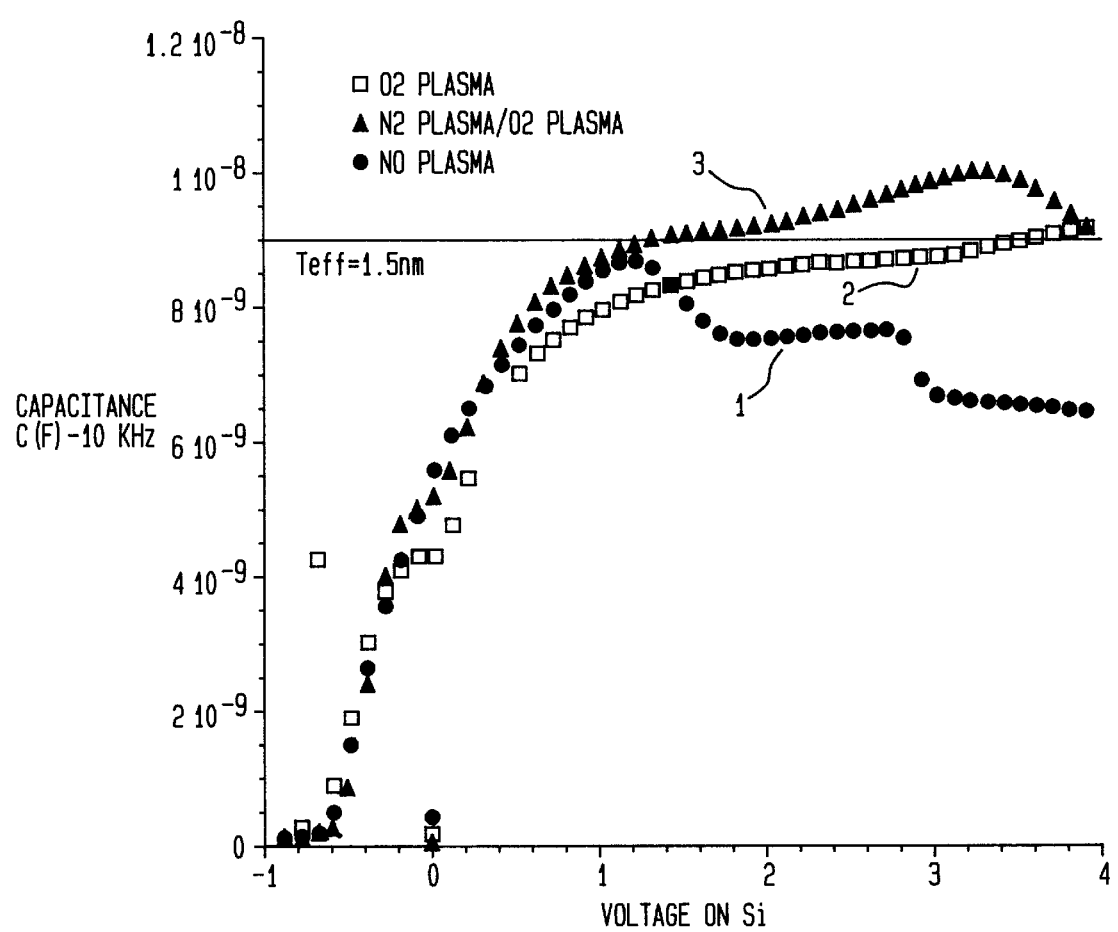
FIG. 3 is a graphical illustration showing the capacitance as a function of voltage for three different devices.

FIG. 3 is a graphical illustration showing the effect of plasma treatment on the capacitance of a 100 angstrom tantalum oxide film deposited on silicon. Curve 1 shows the capacitance at various voltages of an untreated film. Note the marked drop as the voltage increases beyond one volt. Curve 2 shows the effect of treatment for 1 minute in $O_2$ plasma at 300° C., and curve 3 shows similar treatment with $N_2$ plasma, then $O_2$ plasma. At 4 volts, the capacitance of the treated films is more than 60% greater than the untreated film.

Figure 4:
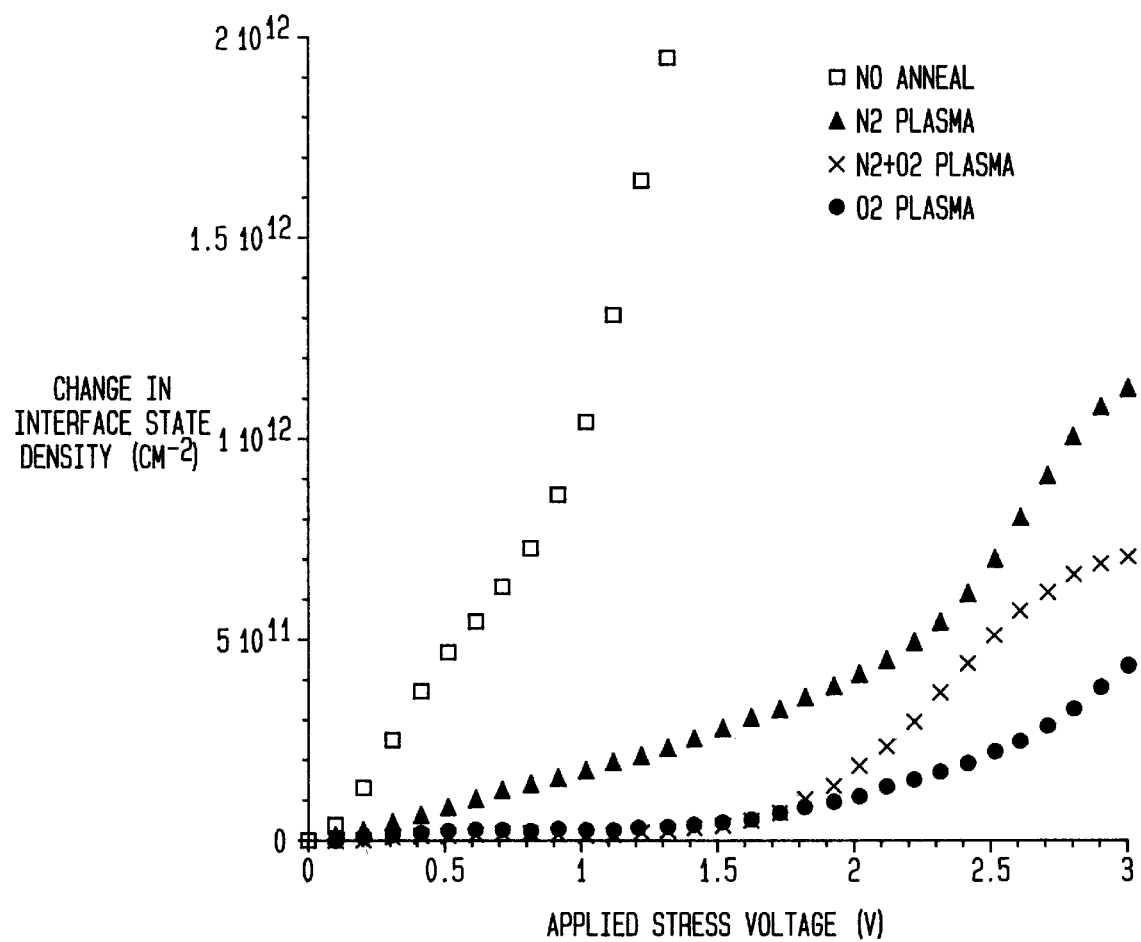
FIG. 4 is a graphical illustration showing the change in interface state density as a function of stress voltage for four different devices.

FIG. 4 is a graphical illustration showing the effect of plasma treatment on the interface state density. Exposures to $N_2$ plasma, $O_2$ plasma or $N_2$ plasma/$0_2$ plasma all produced devices with a significantly smaller change in interface state density for typical applied voltages.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed:

1. A method of making an electronic device having an improved thin film of dielectric material comprising tantalum oxide comprising the steps of:

providing a substrate including an exposed silicon surface;

depositing a film of dielectric tantalum oxide on said exposed silicon surface;

exposing the resulting structure to plasma to reduce the density of charge traps at the interface between said film of dielectric tantalum oxide and said silicon;

forming an electrode overlying said film of dielectric; and completing said electronic device.

2. The method of claim 1 wherein said dielectric material is a material having a dielectric constant greater than 5.

3. The method of claim 1 wherein said exposing to plasma comprises exposing to an oxygen plasma.

4. The method of claim 1 wherein said exposing to plasma comprises exposing to a nitrogen plasma.

5. The method of claim 1 wherein said exposing to plasma comprises exposing to a plasma of nitrogen or oxygen at a substrate temperature in the range 100–400° C.

6. The method of claim 1 wherein said depositing of dielectric material comprises depositing a film of dielectric having a thickness in the range 2–10 nm.

7. The method of claim 1 further comprising the step of applying a nitrogen-containing material to said dielectric before forming said electrode overlying said dielectric.

8. The method of claim 1 wherein said forming an electrode comprises forming an electrode comprising polysilicon.

* * * * *